United States Patent
Wang et al.

(10) Patent No.: US 7,379,484 B2
(45) Date of Patent: May 27, 2008

(54) LASER DIODE CONTROL CIRCUIT LOOP

(75) Inventors: Chihyang Wang, Hsinchu (TW); Yu Tung Chen, Hsinchu (TW)

(73) Assignee: TM Technology Inc., Hsinchu (TW)

( * ) Notice: Subject to any disclaimer, the term of this patent is extended or adjusted under 35 U.S.C. 154(b) by 87 days.

(21) Appl. No.: 11/409,973

(22) Filed: Apr. 25, 2006

(65) Prior Publication Data

US 2007/0104235 A1    May 10, 2007

(51) Int. Cl.
*H01S 3/00* (2006.01)
(52) U.S. Cl. ................. 372/38.02; 373/38.07; 373/29.015
(58) Field of Classification Search ............ 372/38.02, 372/38.07, 29.015
See application file for complete search history.

(56) References Cited

FOREIGN PATENT DOCUMENTS

JP        63-76493    *   4/1988

* cited by examiner

*Primary Examiner*—Dung T. Nguyen
(74) *Attorney, Agent, or Firm*—Rosenberg, Klein & Lee

(57) ABSTRACT

A laser diode control circuit loop comprises a reference circuit with a programmable reference current, a first endpoint thereof providing a first voltage and a second endpoint thereof providing a second voltage, according as the reference current passing through the first endpoint and the second endpoint; and a driving circuit, a third endpoint thereof connected to the first endpoint of the reference circuit, a fourth thereof connected to the second endpoint of the reference circuit, a output end thereof providing a driving voltage and an output current, and the reference current of the reference circuit and the output current of the driving circuit are as direct ratio. With regard to the operation field of the laser diode driving circuit, the operation limitation within low voltage can be got over, according as the output current from the reference current matching.

14 Claims, 2 Drawing Sheets

LASER DIODE CONTROL CIRCUIT LOOP

FIELD OF THE INVENTION

The present invention relates to a laser diode control circuit loop, and more particularly to a laser diode control circuit loop within high speed and low voltage operation, wherein with regard to the operation field of the laser diode driving circuit, the operation limitation within low voltage can be got over, according as the output current from the reference current matching.

BACKGROUND OF THE INVENTION

Due to the giant strides of electrical industry processing, the demand for the electrical product efficiency is getting more and more. As function of the product is getting variety; the circuit design is getting complication. However, when a precise and complicated circuit is operated within high supply voltage, such not only causes high power consumption and affects the response time, but also reduces the yield of the semiconductor process for the circuit manufacturing.

In accordance with the general laser diode control circuit loop as the prior art, the output driving voltage should be as higher voltage operation to ensure that the laser diode driving circuit works in a normal operation status. The device as shown on FIG. 1, comprises a high speed switch unit 13, a third transistor 135, a laser diode 11, and a load resistor 17. The high speed switch unit 13 further comprises a first transistor 131 and a second transistor 133. And, the first transistor 131 and the second transistor 133 are respectively as a NPN bipolar transistor.

The collector end of the first transistor 131 connects with a supply voltage 13 through the load resistor 17. The collector end of the second transistor 133 connects to the laser diode 11, and the laser diode 11 connects with the supply voltage 12. The base end of the first transistor 131 can receive a first voltage 141, and the base end of the second transistor 133 can receive a second voltage 143. The emitter end of the first transistor 131 and the second transistor 133 connect with the collector end of the third transistor 135, and a rear current is generated from the third transistor 135.

The emitter end of the third transistor 135 connects to the ground, and the base end thereof receives an input bias 155, which supplies the third transistor 135 works in the operation area.

The prior art laser diode driving circuit 10 works within high voltage operation by supply voltage 12 (such as 5V). The supply voltage 12 subtracts the critical voltage of the laser diode 12 (such as 1.8V), the output driving voltage of the output driving voltage end 19 is 3.2V, such supplies enough for the high speed switch unit 13 and the third transistor 135 working in the operation area. Thus, when the supply voltage 12 is 5V, the laser diode driving circuit 10 can be worked regularly.

When the supply voltage 12 is as low voltage (such as 3.3V), the supply voltage 12 subtracts the critical voltage of the laser diode (1.8V), the output driving voltage of the output driving voltage end 19 is only 1.5V. Referring to the conducting wire of the circuit, the impedance factor of the series resistance, and the individual critical voltage Vbe of the high speed switch unit 13 and the third transistor 135, the output driving voltage must be larger than 1.8V to ensure that the high speed switch unit 13 and the third transistor 135 can be worked in operation area. Obviously, the supply voltage 12 is insufficient, which causes the failure operation for the laser diode driving circuit 10.

However, the low power consumption is the mainstream product nowadays. The supply voltage 12 of many electrical products is getting to be used as low voltage (such as 3.3V) from prior high voltage (such as 5V). Therefore, the laser diode driving circuit 10 works within high voltage supply should not be suitable for the demand of the recent circuit design.

SUMMARY OF THE INVENTION

Accordingly, how to design a laser diode control circuit within high speed and low supply voltage operation with respect to the previous mentioned shortcomings of the prior art laser diode driving circuit working in high voltage operation, is the key point of the present invention. Therefore, It is a primary object of the present invention to provide a laser diode control circuit loop, increasing the operation field of the output driving voltage of the laser diode driving circuit, according as the low voltage operation.

It is a secondary object of the present invention to provide a laser diode control circuit loop, wherein with regard to the operation field of the laser diode driving circuit, the operation limitation within low voltage can be got over, according as the output current of the laser diode control circuit loop from the reference current of the reference circuit matching.

It is another object of the present invention to provide a laser diode control circuit loop for saving the power consumption of the laser diode control circuit loop according to be worked within low voltage operation.

It is another object of the present invention to provide a laser diode control circuit loop for speeding the operation time of the laser diode control circuit loop according to be worked within low voltage operation.

To achieve the previous mentioned objects, the present invention provides a laser diode control circuit loop, comprising a reference circuit with a programmable reference current, a first endpoint thereof providing a first voltage and a second endpoint thereof providing a second voltage, according as the reference current passing through the first endpoint and the second endpoint; and a driving circuit, a third endpoint thereof connected to the first endpoint of the reference circuit, a fourth thereof connected to the second endpoint of the reference circuit, a output end thereof providing a driving voltage and an output current to drive the laser diode.

BRIEF DESCRIPTION OF THE DRAWINGS

It will be understood that the figures are not to scale since the individual layers are too thin and the thickness differences of various layers too great to permit depiction to scale.

DETAILED DESCRIPTION OF THE INVENTION

The structural features and the effects to be achieved may further be understood and appreciated by reference to the presently preferred embodiments together with the detailed description.

Figure 1:
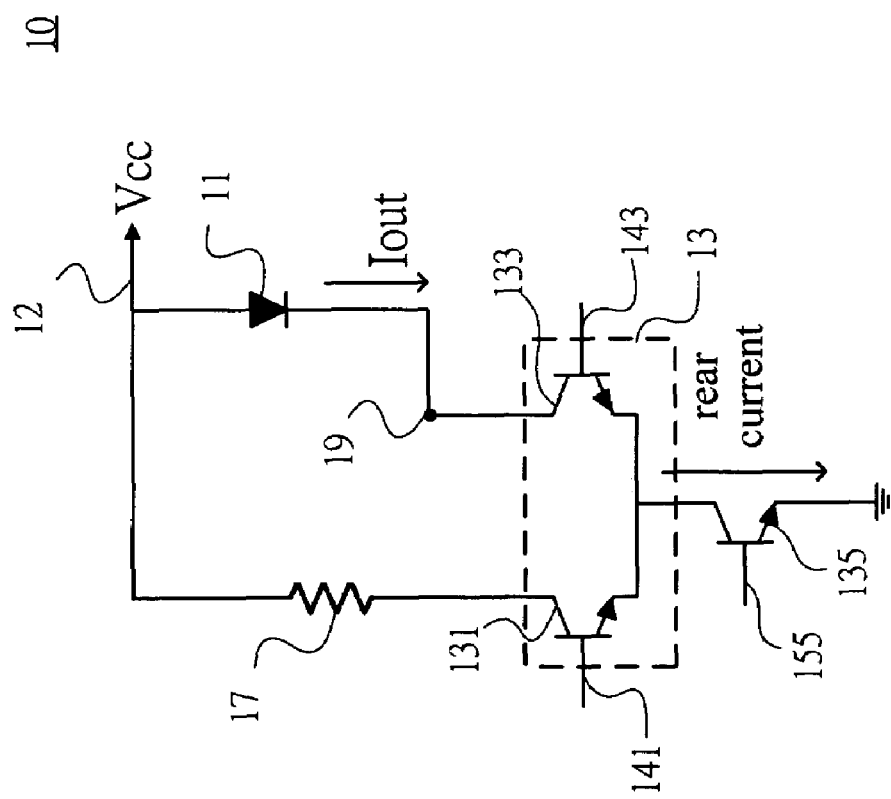
FIG. 1 is a circuit diagram of a prior art laser diode driving circuit.
Figure 2:
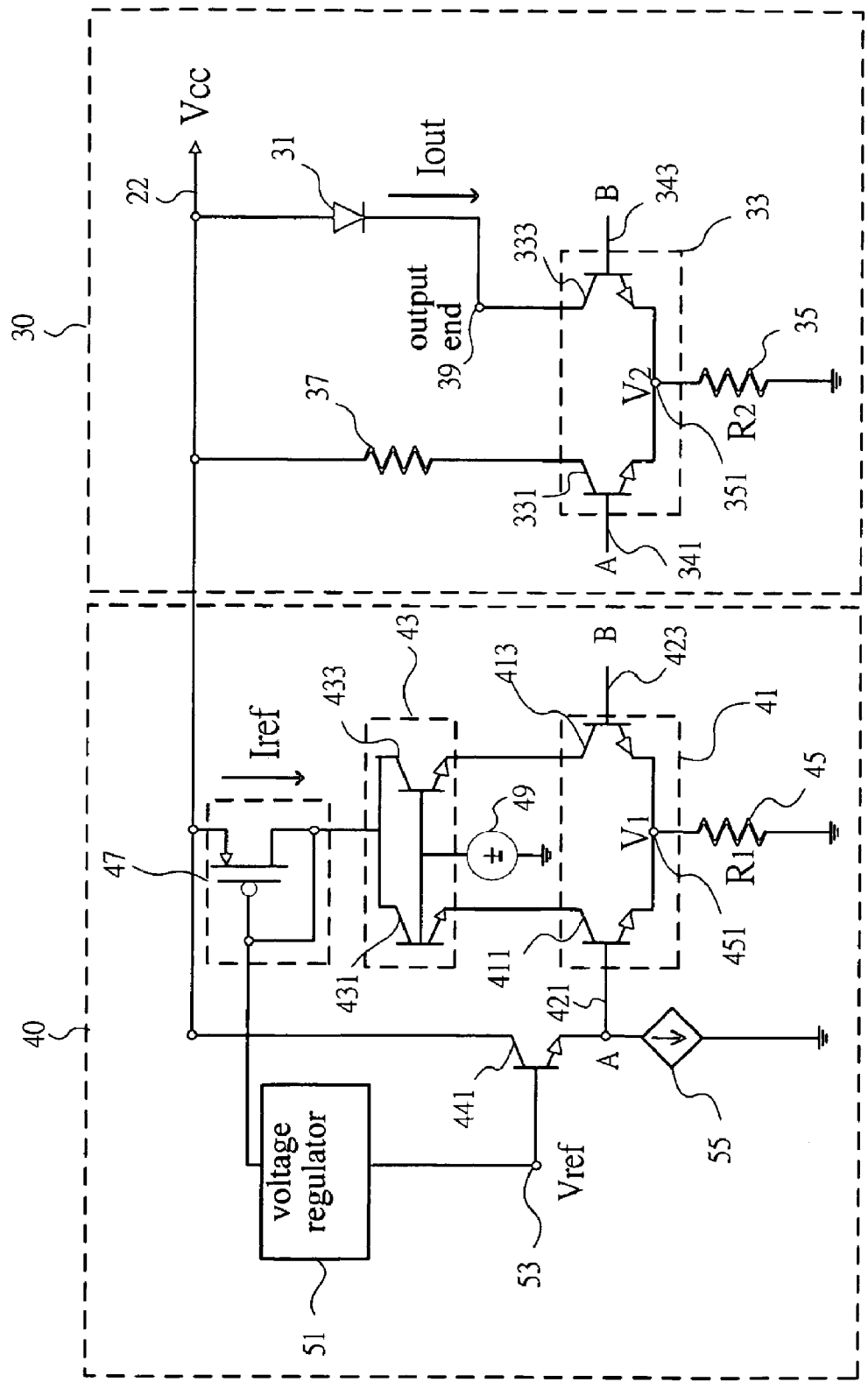
FIG. 2 is a circuit diagram of a preferred embodiment of the present invention.

Referring to FIG. 2, is a circuit diagram of a preferred embodiment of the present invention. The laser diode control circuit loop 20 comprises a reference circuit 40 and a driving circuit 30.

The reference circuit 40 is with a programmable reference current Iref, generated by a current source switch unit 47. The current source switch unit 47 is as a P-type MOSFET, the gate end and the drain end thereof are connected together, and the source end thereof is connected to a supply voltage 22.

Except current source switch unit, the reference circuit 40 further comprises a first high speed switch unit 43, a second high speed switch unit 41, an emitter follower 441, and a voltage regulator 51.

The second high speed switch unit 41 comprises a third transistor 411 and a fourth transistor 413. The third transistor 411 and the fourth transistor 413 are respectively as a NPN bipolar transistor. The base end of the third transistor 411 and the fourth transistor 413 are respectively regarded as the first endpoint 421 and the second endpoint 423 of the reference circuit 40. The first voltage Va is provided at the endpoint A of the first endpoint 421, and the second voltage Vb is provided at the endpoint B of the second endpoint 423.

The emitter end of third transistor 411 and the fourth transistor 413 are connected to the fifth endpoint 451. The fifth endpoint 451 is connected to a first resistor 45. The fifth endpoint 451 can provide a fifth endpoint voltage V1 and the reference current. The reference current Iref is as direct ratio with the fifth endpoint voltage V1 and as inverse ratio with the first resistor 45.

The base end of the third transistor 411, the emitter follower 441, and a current source 55 are connected within the endpoint A to ensure that second high speed switch unit 41 works in operation area according as the bias current of the current source 55.

The first high speed switch unit 43 comprises a first transistor 431 and a second transistor 433. The first transistor 431 and the second transistor 433 are respectively as a NPN bipolar transistor. The first high speed switch unit 43 is connected between the current source switch unit 47 and the second high speed switch unit 41.

The collector end of the first transistor 431 and the second transistor 433 are connected with the current source switch unit 47. The base end of the first transistor 431 and the second transistor 433 are connected together, and connecting to a voltage source 49. And, the emitter end of the first transistor 431 and the second transistor 433 are respectively connected with the collector end of the third transistor 411 and the fourth transistor 413 of the second high speed switch unit 41. With regard to first transistor 431 and the second transistor 433, the first high speed switch unit 43 can be worked in operation area according as the bias of the voltage source 49.

The voltage regulator 51 is connected with the gate end and the drain end of the current source switch unit 47, and provides a reference voltage Vref on the reference voltage end 53 of the voltage regulator, wherein the reference current Iref generated by the current source switch unit 47 passes through the reference voltage end 53.

The emitter follower 441 is as a NPN bipolar transistor, the collector end thereof is connected to the supply voltage 22, and the base end thereof is connected to the voltage regulator 51 for receiving the reference voltage Vref. Therefore, the emitter end of the emitter follower 441 generates the first voltage Va. And the emitter end of the emitter follower and the first endpoint 421 of the current source 55 are connected within the endpoint A.

The first endpoint 421 generates the first voltage Va through the emitter follower 441. The second endpoint 423 correspondingly generates the second voltage Vb by utilizing designed as current mirror. According as the first transistor 411 and the second transistor 413 are the transistors of current mirror, therefore, the first voltage Va equals to the second voltage Vb.

The driving circuit 30 generates an output current Iout, which is provided by matching the reference current Iref of the reference circuit 40. The driving circuit 30 comprises a third high speed switch unit 33, a laser diode 31 and a load resistor 37.

The third high speed switch unit 33 comprises a fifth transistor 331 and a sixth transistor 333. The fifth transistor 331 and the sixth transistor 333 are respectively as a NPN bipolar transistor.

The base end of the fifth transistor 331 and the sixth transistor 333 are respectively as the third endpoint 341 and the fourth endpoint 343 of the reference circuit 40. The third endpoint 341 and the first endpoint 421 are connected within the endpoint A. The voltage level of the third endpoint 341 and the first endpoint 421 are the same as well as the first voltage Va.

The fourth endpoint 343 and the second endpoint 423 are connected with the endpoint B. The voltage level of the fourth endpoint 343 and the second endpoint 423 are the same as well as the second voltage Vb. The collector end of the fifth transistor 331 is connected to the supply voltage 22 through the load resistor 37. The collector end of the sixth transistor 333 is connected to the supply voltage 22 through the laser diode 31. The emitter end of the fifth transistor 331 and the sixth transistor 333 are connected within the sixth endpoint 351, and the sixth endpoint 351 is connected with a second resistor 35. Thus, the sixth endpoint 351 is provided a sixth endpoint voltage V2 and the output current Iout, wherein the output current Iout is as direct ratio with the sixth endpoint 351 voltage V2, and as inverse ratio with the second resistor 35.

In accordance with the present invention, the current density of the first high speed switch unit 43 and the second high speed switch unit 41 of the reference circuit 40 are as well as the third high speed switch unit 33 and the output end 39 of the driving circuit 30. The resistance value of the first resistor 45 of the reference circuit 40 can be set as integer multiples with the second resistor 35 of the driving circuit 30, such as example for resistance ratio N:1. And, the first resistor and the second resistor are respectively as a variable resistor.

The matching relationship of the output current Iout of the driving circuit 30 and the reference current Iref of the reference circuit 30 is as following description.

The previous description can be expressed by the equation;

$$V_1 = Va - Vbe$$

$$V_2 = V_1$$

$$Iout = \frac{Va - Vbe}{R2} \qquad (1)$$

$$Iref = \frac{Va - Vbe}{R1}$$

$$Iout = \frac{R1}{R2} * Iref$$

$$Vref - Vbe = Va \qquad (2)$$

The Iout can be provided by substituting the (2) into (1)

$$Iout = \frac{Vref - 2Vbe}{R2} \quad (3)$$

The driving voltage of the output end 39 of the laser diode control circuit loop 20 must be larger than 0.75V according to consider the critical voltage Vbe of the sixth transistor 333 and the impedance factor of the conducting wire of circuit and the series resistor. Therefore, when the supply voltage 22 is as low voltage operation (such as 3.3V), the supply voltage 22 subtracts the critical voltage 1.8V of the laser diode 31 to provide 1.5V as the driving voltage at the output driving voltage end 19. The driving voltage is much larger than 0.75V to ensure enough that the laser diode control circuit loop 20 works regularly, and even suitable for reducing the supply voltage 22 to be the low voltage 2.6V.

According to the above mentioned, the present invention laser diode control circuit loop is with the reference circuit design for controlling the output current of the driving circuit by a reference current to ensure that the laser diode driving circuit works regularly, when the output driving voltage of the laser diode driving circuit is larger than 0.75V.

In summary, it is appreciated that the present invention is related to a laser diode control circuit loop, and more particularly to a laser diode control circuit loop within high speed and low voltage operation, wherein with regard to the operation field of the laser diode driving circuit, the operation limitation within low voltage can be got over, according as the output current from the reference current matching.

The foregoing description is merely one embodiment of present invention and not considered as restrictive. All equivalent variations and modifications in process, method, feature, and spirit in accordance with the appended claims may be made without in any way from the scope of the invention.

LIST OF REFERENCE SYMBOLS

10 laser diode driving circuit
11 laser diode
12 supply voltage
13 high speed switch unit
131 first transistor
133 second transistor
135 third transistor
141 first voltage
143 second voltage
155 input bias
17 load resistor
19 output driving voltage end
20 laser diode control circuit loop
22 supply voltage
30 driving circuit
31 laser diode
33 third high speed switch unit
331 fifth transistor
333 sixth transistor
341 third endpoint
343 fourth endpoint
35 second resistor
351 sixth endpoint
37 load resistor
39 output end
40 reference circuit
41 second high speed switch unit
411 third transistor
413 fourth transistor
421 first endpoint
423 second endpoint
43 first high speed switch unit
431 first transistor
433 second transistor
441 emitter follower
45 first resistor
451 fifth endpoint
47 current source switch unit
49 voltage source
51 voltage regulator
53 reference voltage end
55 current source

We claim:

1. A laser diode control circuit loop, comprising:
a reference circuit with a programmable reference current, generated by a current source switch unit, a first endpoint of said reference circuit providing a first voltage and a second endpoint of said reference circuit providing a second voltage, according as said reference current passing through said first endpoint and said second endpoint;
a voltage regulator connected to said current source switch unit for providing a reference voltage according as said reference current;
a first high speed switch unit connected with said current source switch unit and said voltage regulator;
a second high speed switch unit with said first endpoint and said second endpoint, connected to a first resistor within a fifth endpoint; wherein another end of said first resistor is connected to ground, said fifth endpoint generates a fifth endpoint voltage, and the current of said fifth endpoint is as said reference current;
an emitter follower connected with said voltage regulator and said first endpoint for receiving said reference voltage to provide said first voltage and provide a corresponding second voltage within said second endpoint; and
a driving circuit, a third endpoint thereof connected to said first endpoint of said reference circuit, a fourth endpoint thereof connected to said second endpoint of said reference circuit, an output end thereof providing a driving voltage and an output current to drive said laser diode.

2. The control circuit loop of claim 1, wherein said current source switch unit is a P-Type MOSFET, the gate end thereof is connected to said voltage regulator, the source end thereof is connected to a supply voltage, and the drain end thereof is connected to said first high speed switch unit.

3. The control circuit loop of claim 1, wherein said first high speed switch unit comprises a first transistor and a second transistor, and said first transistor and said second transistor are respectively as a N-type bipolar transistor.

4. The control circuit loop of claim 3, wherein the collector end of said first transistor and said second transistor are connected with said current source switch unit, the base end of said first transistor and said second transistor are connected with a voltage source, and emitter end of said first transistor and said second transistor are respectively connected to said second high speed switch unit.

5. The control circuit loop of claim 1, wherein said second high speed switch unit comprises a third transistor and a fourth transistor, said third transistor and said fourth transistor are respectively as a N-type bipolar transistor.

6. The control circuit loop of claim 5, wherein base end of said third transistor is the first endpoint of said reference circuit, connected with said emitter follower and a current source, the base end of said fourth transistor is the second endpoint of said reference circuit, the collector end of said third transistor and said fourth transistor are respectively connected to said fourth high speed switch unit, and the emitter end of said third transistor and said fourth transistor are connected with the fifth endpoint of said first resistor.

7. The control circuit loop of claim 1, wherein said emitter follower is as a N-type bipolar transistor, the collector end thereof is connected with a supply voltage, the base thereof is connected to said voltage regulator for receiving said reference voltage, and the emitter end thereof is connected with a current source and the first endpoint of said reference circuit.

8. The control circuit loop of claim 1, wherein said driving circuit comprises:
 a third high speed switch unit with said third endpoint and said fourth endpoint, respectively connected to the first endpoint and second endpoint of said reference circuit, and connected to a second resistor within a sixth endpoint;
 said laser diode connected between an output end of said third high speed switch unit and a supply voltage; and
 a load resistor connected between said third high speed switch unit and said supply voltage for protecting said laser diode.

9. The control circuit loop of claim 8, wherein said third high speed switch unit comprises a fifth transistor and a sixth transistor, and said fifth transistor and said sixth transistor are respectively as a N-type bipolar transistor.

10. The control circuit loop of claim 9, wherein the collector end of said fifth transistor is connected to said load resistor, the collector end of said sixth transistor is connected to said laser diode, the base end of said fifth transistor and said sixth transistor are respectively as the third endpoint and fourth endpoint of said driving circuit, respectively connected to the first endpoint and second endpoint of said reference circuit, the emitter end of said fifth transistor and sixth transistor are connected to said second resistor within said sixth endpoint.

11. The control circuit loop of claim 8, wherein said first high speed switch unit, said second high speed switch unit, said third high speed switch unit, and said output current are as the same current density.

12. The control circuit loop of claim 8, wherein resistance value of said first resistor is integer multiples with said second resistor.

13. The control circuit loop of claim 8, wherein said first resistor and said second resistor are respectively as a variable resistor.

14. The control circuit loop of claim 1, wherein said output current of said driving circuit and said reference current of said reference circuit are as direct ratio.

* * * * *